US008004158B2

(12) United States Patent
Hielscher

(10) Patent No.: US 8,004,158 B2
(45) Date of Patent: Aug. 23, 2011

(54) METHOD AND DEVICE FOR COOLING ULTRASONIC TRANSDUCERS

(75) Inventor: Harald Hielscher, Stahnsdorf (DE)

(73) Assignee: Dr. Hielscher GmbH, Teltow (DE)

( * ) Notice: Subject to any disclaimer, the term of this patent is extended or adjusted under 35 U.S.C. 154(b) by 898 days.

(21) Appl. No.: 10/535,868

(22) PCT Filed: Nov. 19, 2003

(86) PCT No.: PCT/EP03/13003

§ 371 (c)(1),
(2), (4) Date: Dec. 1, 2005

(87) PCT Pub. No.: WO2004/047073

PCT Pub. Date: Jun. 3, 2004

(65) Prior Publication Data

US 2006/0126884 A1 Jun. 15, 2006

(30) Foreign Application Priority Data

Nov. 20, 2002 (DE) .................................. 102 54 894

(51) Int. Cl.
*H01L 41/08* (2006.01)

(52) U.S. Cl. .................... 310/346; 310/323.01; 310/325

(58) Field of Classification Search .................. 310/341, 310/342
See application file for complete search history.

(56) References Cited

U.S. PATENT DOCUMENTS 2,917,642 A * 12/1959 Wright et al. ................. 310/338
3,104,335 A * 9/1963 Shoor ........................... 310/329
3,171,989 A * 3/1965 Hatschek ....................... 310/338
3,555,297 A * 1/1971 Pierson .......................... 310/325
3,694,675 A * 9/1972 Loveday ........................ 310/325
3,845,332 A * 10/1974 Last .............................. 310/325
4,553,059 A * 11/1985 Abe et al. ....................... 310/328
5,560,362 A 10/1996 Sliwa, Jr. et al.
(Continued)

FOREIGN PATENT DOCUMENTS

CN 1308831 A 8/2001
(Continued)

OTHER PUBLICATIONS

English Language Translation of JP 3061292 U.

(Continued)

*Primary Examiner* — Mark Budd
(74) *Attorney, Agent, or Firm* — Norris McLaughlin & Marcus, P.A.

(57) ABSTRACT

The invention relates to a method and a device for cooling ultrasonic transducers. The inventive device is characterised in that it consists of at least one piezo stack (4) and at least two cylindrical transducer bodies (5), which together with the piezo stack (4) form an λ/2 oscillator. In multiple transducer assemblies, two respective transducer bodies (5) can be combined to form a common transducer body (6) and the transducer bodies (5, 6) comprise flow channels (7), through which pressurised coolant can flow. The inventive method for cooling ultrasonic transducers is characterised in that the body of the ultrasonic transducer is traversed and/or surrounded by a pressurised coolant. This enables the heat that is generated in the transducers to be directly dissipated by convection. In addition the inventive elements enable the creation of a large common contact surface between the transducers and the coolant. The heat dissipation achieved is substantially more effective than in known methods and the inventive elements thus guarantee a high-performance continuous operation.

5 Claims, 3 Drawing Sheets

U.S. PATENT DOCUMENTS

Figure 1:
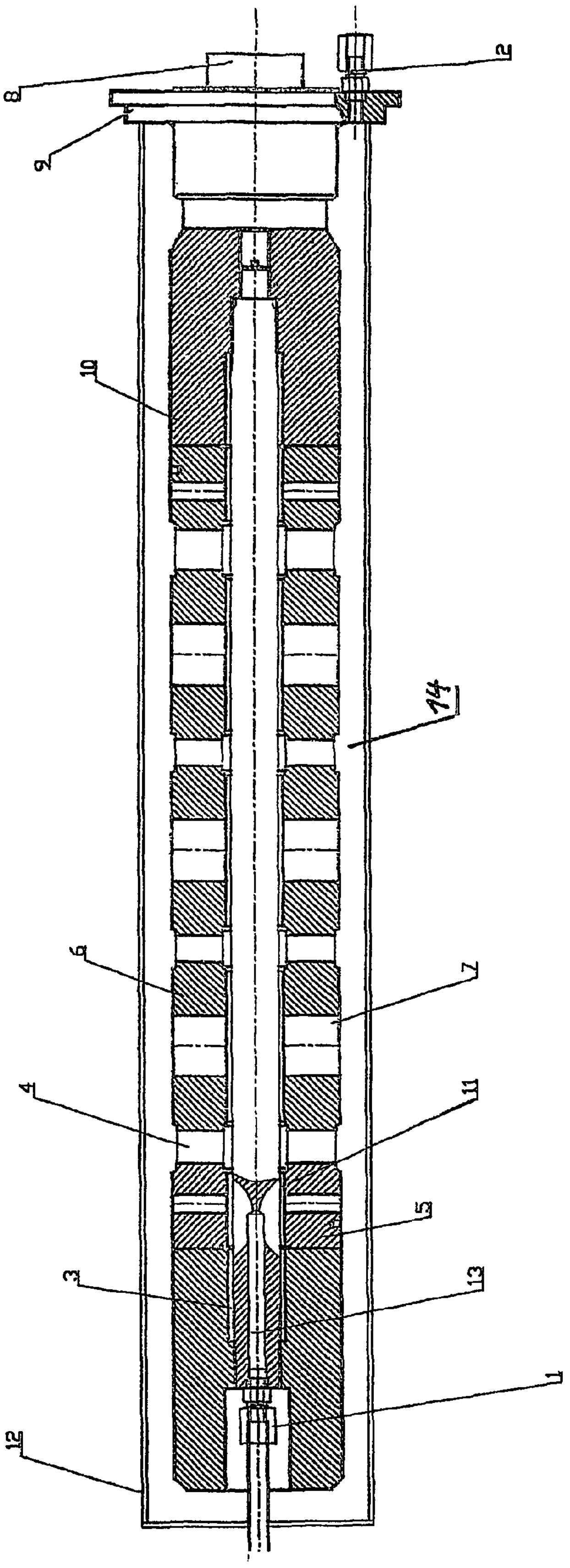

| | | | | |
|---|---|---|---|---|
| 5,936,163 A | | 8/1999 | Greathouse | 73/644 |
| 5,955,823 A | * | 9/1999 | Nilsson et al. | 310/346 |

FOREIGN PATENT DOCUMENTS

| | | | |
|---|---|---|---|
| DE | 40 26 458 | A1 | 2/1992 |
| DE | 198 37 262 | A1 | 3/2000 |
| DE | 100 27 264 | C1 | 1/2002 |
| EP | 0 553 804 | A2 | 1/1993 |
| EP | 0 782 125 | A2 | 12/1996 |
| JP | 2002-515717 | T | 5/2002 |
| JP | 3061292 | U | 6/2002 |
| WO | WO 00/08630 | | 2/2000 |

OTHER PUBLICATIONS

English Language Abstract for JP 2002-515717 T.
English Language Abstract for CN 1308831A.

* cited by examiner

METHOD AND DEVICE FOR COOLING ULTRASONIC TRANSDUCERS

The invention relates to a method and a device for cooling ultrasonic transducers with the features recited in the preambles of claim 1.

During the operation of ultrasonic transducers, power losses are converted into heat. These losses are caused, on one hand, by electrical losses and, on the other hand, by internal friction in the piezo elements produced when electric energy is converted into mechanical energy. Different methods are generally known to efficiently remove the generated heat. Conventional cooling systems are based on heat transfer by thermal conduction or convection. In most cases, a combination of these two operating principles is employed.

High-power ultrasonic transducers, which inherently have a large oscillation amplitude, are difficult to cool, because large quantities of heat must be removed without generating more friction or additional heat. Thus far, only gaseous media have been used successfully to efficiently remove heat by convection, because cooling fluids tend to generate substantial quantities of additional energy due to cavitations, potentially damaging the transducer. Large quantities of gas at high-pressure are required when with gas, which makes this cooling method quite uneconomical. Moreover, the cooling gas must be free of solid or liquid contaminants to prevent short-circuits caused by the formation of bridge circuits at the high voltages at which the high-power ultrasonic transducers operate.

EP 0553804 A2 discloses a cooling system for a high-frequency ultrasonic converter based on thermal conduction. A heat sink is arranged behind the ultrasonic converter and connected with the housing by a heat-conducting resin. The heat is initially transmitted from the transducer to the heat sink and from there via the resin to surrounding housing, from where the heat is carried away by the ambient air. This type of cooling is inadequate for high-power devices and cannot be used at large oscillation amplitudes of several micrometers, because a large amount of energy is then transferred to the resin.

In many cases, the cooling systems for ultrasonic converters operate exclusively by removing heat by convection through openings disposed in a housing surrounding the transducer (e.g., SONOPULS HD 60, BANDELIN electronic GmbH & Co. KG). This type of cooling is also inadequate for high-power applications.

Several modifications of such cooling systems are known, with additional cooling provided by fans or compressed air. With this type of cooling, substantial quantities of dust or moisture can disadvantageously be transported into the housing, which increases the danger of electric short-circuit due to the formation of bridge circuits by electrically conducting contaminants. Also known are closed systems with a fan and heat exchange from the inside to the outside. These systems are also quite complex and only allow limited heat removal.

EP 0782125 A2 discloses an arrangement for cooling a high-frequency ultrasonic transducer, whereby a heat-conducting pipe carrying a liquid is connected with a heat sink arranged downstream of the transducer. The cooling fluid is supplied and removed via connecting lines. The heat is thus removed from the heat sink by convection. In a particular embodiment of this cooling system, the heat-conducting pipe is entirely or partially formed as a channel in the material surrounding the transducer for obtaining a particularly large contact surface. The cooling fluid does not flow through the ultrasonic transducer, but rather flows through a cooling system that is in contact with the transducer. This arrangement, too, is inadequate for efficient heat removal from high-power devices.

WO 0008630 A1 discloses an arrangement for removing heat, in particular from ultrasonic transducers operating at high power. Heat removal is based on a combination of thermal conduction and convection. The surface of the transducer body is provided with a vibration-absorbing layer, which reduces mechanical friction losses during heat transfer. A layer of heat conducting material is disposed above the vibration-absorbing layer. A heat sink, from which the heat can be removed by cooling means through convection, is arranged on the heat conducting layer. This arrangement has the disadvantage that the temperature gradients at the transitions between layers reduce the efficiency of heat removal. Moreover, the maximum common contact surface between the transducer and the cooling device is limited to the transducer surface. Ultrasonic transducers can therefore operate continuously at high power only when large quantities of cooling fluid are supplied, which makes the method quite uneconomical.

U.S. Pat. No. 5,936,163 discloses an ultrasonic transducer, which is used in high temperature environments, such as reactors and steam pipes. For removing heat introduced into the transducer from the surroundings, the body of the ultrasonic transducer is cooled by a circulating cooling medium.

All these known solutions tend to prevent ultrasonic transducers from operating continuously at high power levels and/or tend to allow continuous operation only with diminished efficiency.

It is therefore an object of the invention to provide a method and a device for cooling ultrasonic transducers, which remove the heat generated by thermal losses more effectively than previously known devices and which therefore enable ultrasonic transducers to reliably and economically operate continuously even at high power levels.

The object is solved by the invention by a method having the features recited in claim 1. The method according to the invention for cooling ultrasonic converters is characterized in that a cooling fluid flows through and/or around the body of the ultrasonic transducer. In this way, the heat generated in the transducers is advantageously removed directly through convection. No thermal conduction via heat sinks is required. The flow through the transducer provides a large common contact surface between the converters and the cooling fluid. The heat is much more effectively removed than with conventional methods, with the means according to the invention therefore allowing ultrasonic transducers to operate continuously at high power levels.

Advantageously, within the context of the present method, the pressure of the cooling fluid is dimensioned so as to reduce or prevent cavitations.

Preferably, the pressure is set in a range from 2 to 20 bar, preferably 5 bar. This approach significantly reduces the risk of damaging the device through cavitations and reduces or even prevents cavitations which can introduce additional energy.

The pressure of the cooling fluid can be generated by suitably dimensioning the flow-through channels and/or by a gas pressure.

Moreover, in the context of the method of the invention, the flow through the body of the ultrasonic transducer is provided from the interior region to the exterior region, whereby fluid pressure is built up in the interior region and cooling fluid is drained via the housing, or from the exterior region to the interior region, wherein pressure is built up in the exterior region and the cooling fluid is drained via the interior region.

This method is removes heat from the transducers with particular efficiency. In addition, to eliminate cavitations, pressure may be established in both the interior region and the exterior region, whereby a pressure gradient must be established between the interior region and the exterior region to allow cooling fluid flow.

In addition, cooling fluid can flow around the body of the ultrasonic transducer preferably in the interior region and/or in the exterior region, because heat is thereby removed from the transducer surface by convection.

The interior region is herein defined as the hollow space between the tensioning rod and the transducer body, whereas the outer region is defined as the space between the transducer body and the housing.

Moreover, in the context of the method of the invention, the cooling fluid may be an electrically non-conducting fluid to prevent electric short-circuits.

The device according to the invention for cooling ultrasonic transducers advantageously includes at least one piezo stack and at least two cylindrical transducer bodies which together with the piezo stack form a λ/2 oscillator, wherein assemblies with multiple transducers can be formed by combining two transducer bodies to a unitary transducer body, and wherein at least one of the at least two transducer bodies includes at least one flow-through channel, through which cooling fluid introduced under pressure can flow. In this way, the heat generated in the transducers can advantageously be removed directly by convection. No heat conduction via heat sinks is required. Moreover, with the means according to the invention, a large common contact surface between the transducers and cooling fluid can be realized. This form of heat removal is significantly more effective than conventional methods, so that the means of the invention enable continuous operation of ultrasonic transducers operating at high power levels.

According to an advantageous embodiment of the invention, the pressure of the cooling fluid is dimensioned so as to reduce or even prevent cavitations. Preferably, the pressure is adjusted in a range from 2 to 20 bar, most preferably the pressure is 5 bar. Advantageously, this approach significantly reduces the risk of damage to the device through cavitations and reduces or prevents the introduction of additional energy generated by cavitations.

Moreover, according to advantageous embodiment of the invention, at least one flow-through channel is formed as a slit, which provides a particularly large common contact surface between the transducer body and cooling fluid, increasing the heat removal efficiency.

According to another advantageous embodiment of the invention, the device includes a tensioning rod arranged in a hollow space of the at least two transducer bodies and having at least two openings and at least one guide channel, through which the pressurized cooling fluid introduced can flow. The cooling fluid can thereby be introduced into the hollow space in a particularly simple and uniform manner.

In addition, according to another advantageous embodiment of the invention, the cooling fluid can be supplied via the at least one guide channel and removed via the at least one flow-through channel. Preferably, the cooling fluid can also be supplied via the at least one flow-through channel and removed via the at least one guide channel disposed in the tensioning rod. In this way, cooling fluid can flow in a particularly straightforward manner through the transducer body from the interior region to the exterior region, or for the exterior region to the interior region.

In addition, according to an advantageous embodiment of the invention, the device includes a fluid-tight housing. The housing is provided, on one hand, for protecting the active elements of the transducer and, on the other hand, represents a particularly advantageous option for receiving and guiding the cooling fluid.

In addition, according to an advantageous embodiment of the invention, the device includes a flange which is connected with the housing and/or with a horn and/or with an end mass. The flange facilitates attaching the housing. Moreover, the horn is a particularly advantageous option for providing a connection with a sonotrode.

According to another advantageous embodiment of the invention, the device includes at least one connection for a cooling fluid line, through which the cooling fluid can flow into and/or can be removed from the hollow space of the transducer bodies. In this way, the hollow space can be easily connected with a cooling fluid supply device and readily supplied with cooling fluid.

According to an advantageous embodiment of the invention, the device has at least one connection for a cooling fluid line, through which the cooling fluid can flow into the at least one guide channel and/or can be removed from the at least one guide channel. In this way, the guide channel can be easily connected with a cooling fluid supply device and readily supplied with cooling fluid.

According to yet another advantageous embodiment of the invention, the device has at least one connection for a cooling fluid line, through which the cooling fluid can flow into the housing and/or can be removed from the housing. In this way, the housing can be easily connected with a cooling fluid supply device and readily supplied with cooling fluid.

Finally, according to still another advantageous embodiment of the invention, the cooling fluid can flow at least partially around the inner surface and/or at least partially around the outer surface of at least one of the at least two transducer bodies. In this way, heat is effectively removed from the transducer bodies by convection.

According to another embodiment of the invention, the transducer bodies do not include flow-through channels. In this embodiment, the cooling fluid only flows around the transducer bodies, with the interior space being connected to the exterior space by a connecting channel.

Additional advantageous embodiments of the invention include features recited in the other dependent claims.

Figure 2:
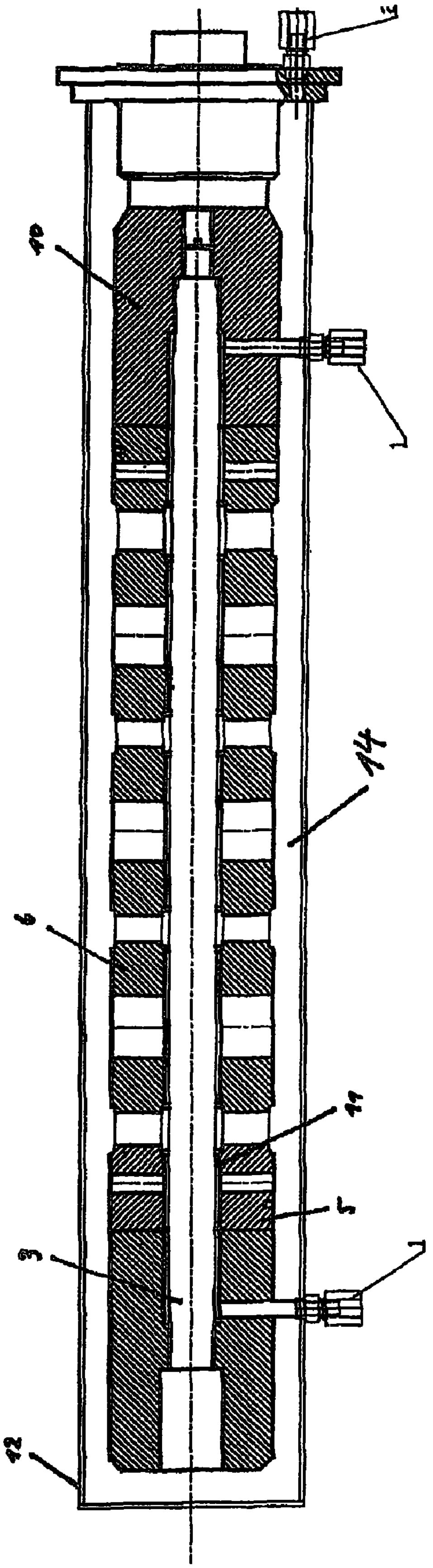
Figure 3:
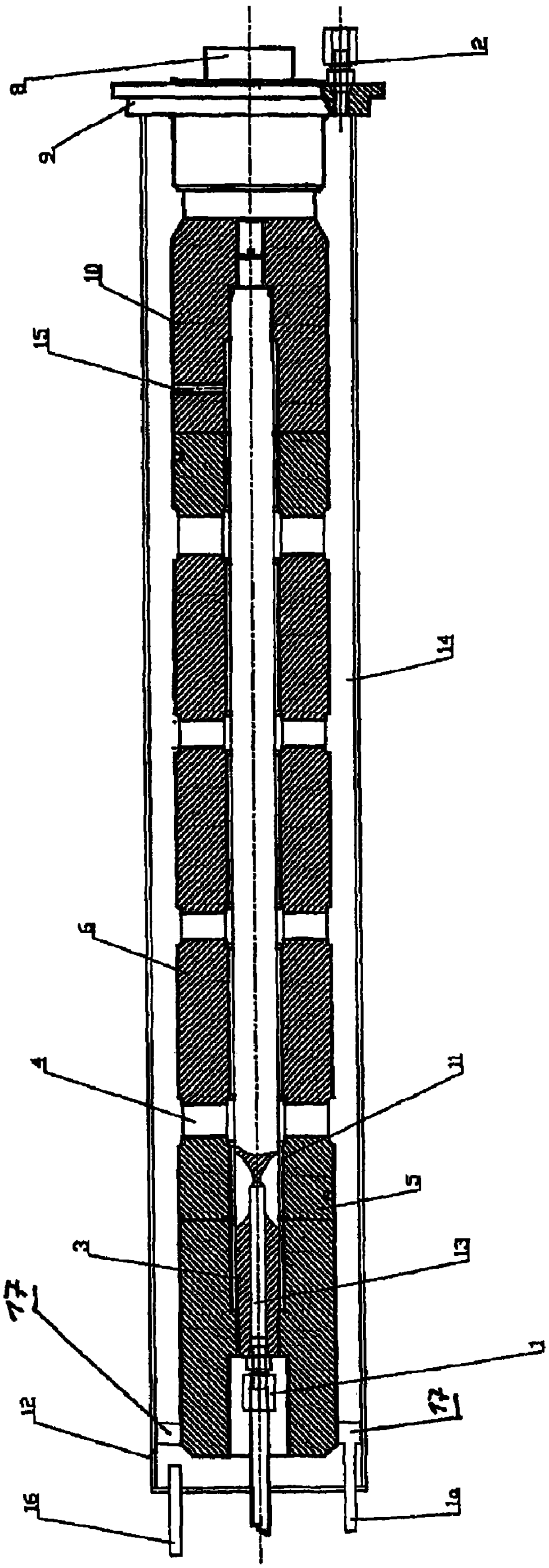

Embodiments of the invention will be described hereinafter with reference to the related drawings. It is shown in:

FIG. 1 a schematic cross-sectional view of an ultrasonic transducer with a cooling device having an axially arranged supply line for the cooling fluid;

FIG. 2 a schematic cross-sectional view of an ultrasonic transducer with a cooling device having two radially arranged supply lines for the cooling fluid; and FIG. 3 a schematic cross-sectional view of an ultrasonic transducer with a cooling device without flow-through channels, and with a connecting channel.

FIG. 1 shows schematically a longitudinal cross-section of an ultrasonic transducer, which includes an embodiment of the device according to the invention for cooling the ultrasonic transducer. The ultrasonic transducer is constructed of cylindrical transducer bodies 5, 6 and piezo stacks 4 which are arranged between the end faces of corresponding transducer bodies 5, 6. Several of the transducer bodies 5, 6 are configured as unitary transducer bodies 6, wherein a respective piezo stack 4 is arranged on each of the end faces. A respective one of the piezo stacks 4 in conjunction with one of the transducer bodies 5 and with either one half of one of the unitary transducer bodies 6 or with one half of two unitary transducer bodies 6 forms a λ/2 oscillator. The transducer bodies 5, 6 have flow-through channels 7 extending in the radial direction. The transducer bodies 5, 6 and piezo stacks 4 are alternatingly arranged on a tensioning rod 3 having terminal threads. This arrangement is secured and tensioned with two threaded end masses 10 which are arranged on opposite sides of the tensioning rod 3, with each of the end masses 10 being screwed on to a terminal thread of the tensioning rod 3. The tensioning rod 3 includes a guide channel 13 for cooling fluid. A connection for a cooling fluid line 1, which forms the supply line 1 for the cooling fluid, is provided on one end of the guide channel 13. The tensioning rod has an exit opening for the cooling fluid that flows out of the guide channel into the hollow space 11 of the transducer bodies. The opposite end mass 10 is connected with a horn 8 capable of connecting to a sonotrode and transmitting the mechanical oscillations generated by the transducer. The device is provided with a fluid-tight housing 12 for receiving the cooling fluid, which is connected with a flange 9 for installation in an external system. The flange 9 is connected with the horn 8. The flange has a connection for a cooling fluid line 2, which forms the drain line 2 for the cooling fluid from the housing 12. The cooling fluid line for the supply 1 runs through the housing 12. The cooling fluid is introduced under pressure into the guide channel 13 of the tensioning rod 3 through the supply line 1. The cooling fluid is supplied into the hollow space 11 of the transducer bodies through the guide channel 13. The cooling fluid then flows through the transducer bodies and finally through the flow-through channels 7 of the transducer bodies 5, 6. The heat generated by the transducers is thereby directly transferred to the cooling fluid through convection. The cooling fluid exiting from the flow-through channels 7 is collected in the housing 12 and removed from the device through the drain 2. In this way, the ultrasonic transducer can be cooled more effectively than with conventional methods. The means of the invention also enable continuous operation of ultrasonic transducers at high power levels.

The lifetime of the transducer bodies can be increased and/or the flow through the slit-like flow-through channels 7 can be improved by providing openings, for example circular bores, on the ends of the flow-through channels 7. Advantageously, the diameter of the bores is greater than the width of the slits.

FIG. 2 shows schematically a longitudinal cross-section of the design of an ultrasonic transducer with another embodiment of the device of the invention for cooling the ultrasonic transducer, which essentially corresponds to the device depicted in FIG. 1. However, unlike the embodiment of FIG. 1, two supply lines 1 for the cooling fluid are provided, which each extend radially from the outside through the housing 12 and the end masses 10 into the hollow space 11 between the tensioning rod 3 and the transducer bodies 5, 6. The connections 1 that connect the cooling fluid lines to the hollow space 11 are here disposed on the opposite ends of the transducer. The cooling fluid is then introduced under pressure into the hollow space 11 from the opposite ends and removed through the flow-through channels 7. This arrangement advantageously removes heat more uniformly over the entire length of the device than the arrangement of FIG. 1. Accordingly, the ultrasonic transducer is cooled more effectively than with the embodiment depicted in FIG. 1.

FIG. 3 shows another embodiment of the invention, wherein the transducer bodies 5, 6 lack flow-through channels 7. However, the interior space 11 is connected to the exterior space 14 by a connecting channel 15.

In a first variant, the cooling fluid is supplied through the supply line 1, reaches the interior space 11 via the guide channel 13, flows around the transducer bodies 5, 6, cooling them, then exits the interior space 11 through the connecting channel 15, and is removed via the exterior space 14 and the drain line 2. In this variant, only the inside of the transducer bodies 5, 6 is cooled.

Alternatively, in a second variant, only the outside of the transducer bodies 5, 6 can be cooled, by supplying cooling fluid through the housing supply line 1*a* and a circular line 17. The cooling fluid supplied through the housing supply line 1*a* is uniformly supplied and distributed by the circular line 17, and flows around the outside of the transducers 5, 6, and forms at least here a cooling fluid layer, before being removed through the drain 2.

In a third variant, both the interior surfaces and the exterior surfaces of the transducer bodies 5, 6 can be cooled by supplying cooling means into the interior space 11 through the supply line 1, and also into the exterior space 14 through the housing supply line 1*a*.

The cooling means supplied through the supply line 1 for cooling the interior surfaces and through the housing supply 1*a* for cooling the exterior surfaces of the transducer elements 5, 6 are removed through the drain line 2.

Cavitations can be prevented with the present embodiment by generating in the housing 12 a gas pressure, in the present embodiment 6 bar, via the gas pressure connection 6.

The invention is not limited to the illustrated embodiments and modifications. Additional embodiments and modifications can be realized by combining the aforedescribed means and features, without departing from the scope and spirit of the invention.

LIST OF REFERENCE SYMBOLS

1 connection for cooling fluid lines, supply line
1*a* housing supply line
2 connection for cooling fluid lines, drain
3 tensioning rod
4 piezo stack
5 transducer body
6 unitary transducer body
7 flow-through channel
8 horn
9 flange
10 end mass
11 hollow space, interior space
12 fluid-tight housing
13 guide channel
14 exterior space
15 connecting channel
16 gas pressure connection
17 circular line

The invention claimed is:

1. Device for cooling ultrasonic transducers, comprising at least one piezo stack (4) and at least two cylindrical transducer bodies (5), which together with the piezo stack (4) form a λ/2 oscillator, wherein two corresponding transducer bodies can be combined as multiple transducer arrangements to form a unitary transducer body (6), characterized in that the transducer bodies (5, 6) are surrounded by an interior space (11) and an exterior space (14), and that at least one of the at least two transducer bodies (5,6) includes at least one flow-through channel (7), through which a cooling liquid introduced under pressure can flow, and/or that at least one connecting channel (15) is arranged between the interior space (11) and the exterior space (14), wherein the cooling liquid flows directly through the transducer bodies (5, 6) through the flow-through channel (7) and/or directly around the transducer bodies (5,6)

through the interior space (11), wherein at least one flow-through channel (7) is formed as a slit and wherein the device further comprises a tensioning rod (3) arranged in a hollow space (11) formed by at least two transducer bodies (5, 6) and having at least one opening and at least one guide channel (13), through which the cooling liquid introduced under pressure can flow, and wherein the device is equipped in such a manner that the cooling liquid can be supplied through the at least one guide channel (13) and removed through the at least one flow-through channel (7), and that the cooling liquid can be supplied through the at least one flow-through channel (7) and removed through the at least one guide channel (13) disposed in the tensioning rod (3).

2. Device according to claim 1, characterized in that the pressure is dimensioned so as to reduce or prevent cavitations, and that the pressure is adjusted in a range from 2 to 20 bar, and preferably is 5 bar.

3. Device according to claim 1, characterized in that the device includes a liquid-tight housing (12) and a flange, which is connected with the housing (12) and with a horn (8), and that the device includes at least one corresponding connection (1, 2) for a cooling liquid through which the cooling liquid can flow into the hollow space (11) and/or be removed from the hollow space (11), or that the device includes at least one corresponding connection (1, 2) for a cooling liquid line, through which the cooling liquid can flow into the at least one guide channel (13) and/or be removed from the at least one guide channel (13), or that the device includes at least one corresponding connection (1*a*,2) for a cooling fluid line, through which the cooling fluid can flow into the housing (12) and/or be removed from the housing (12).

4. Device according to claim 1, characterized in that the cooling liquid can flow at least around a portion of the inner surface and/or at least around a portion of the outer surface of at least one of the at least two transducer bodies (5, 6).

5. Device according to claim 1, characterized in that openings are disposed on the ends of the flow-through channels (7), which openings have a diameter that is greater than the width of the flow-through channels (7).

* * * * *